United States Patent [19]
Chow

[11] Patent Number: 5,157,240
[45] Date of Patent: Oct. 20, 1992

[54] DEPOSITION HEATERS

[76] Inventor: Loren A. Chow, 2317 Byrnes Rd., Minnetonka, Minn. 55343

[21] Appl. No.: 681,338

[22] Filed: Apr. 5, 1991

Related U.S. Application Data

[62] Division of Ser. No. 406,785, Sep. 13, 1989, Pat. No. 5,031,229.

[51] Int. Cl.⁵ .............................................. H05B 3/74
[52] U.S. Cl. ................................... 219/457; 219/464; 219/466; 219/453
[58] Field of Search ............... 219/457, 464, 465, 466, 219/468, 543; 392/435, 438, 439

[56] References Cited

U.S. PATENT DOCUMENTS

| | | | |
|---|---|---|---|
| 3,118,042 | 1/1964 | Parker | 392/435 |
| 3,119,918 | 1/1964 | Simon | 392/435 |
| 3,177,345 | 4/1965 | Plumat | 219/543 |
| 3,539,768 | 11/1970 | Eisler | 392/438 |

Primary Examiner—Teresa J. Walberg
Attorney, Agent, or Firm—Kinney & Lange

[57] ABSTRACT

A gaseous deposition source for providing a deposition material that emanates from a crucible having multiple thin film heating elements formed thereon, with each adjacent pair being separated by an insulating layer therebetween. A gaseous deposition source can have a crucible with a cover thereon with one or more apertures therein and with thin film heating elements on that cover about such apertures. A substrate heater may be used formed of thin film heating elements provided on a base.

4 Claims, 4 Drawing Sheets

DEPOSITION HEATERS

This is a divisional of application Ser. No. 07/406,785, filed Sep. 13, 1989 U.S. Pat. No. 05,031,229.

BACKGROUND OF THE INVENTION

The present invention relates to deposition sources and, more particularly, to such sources for providing superior thin films of selected materials.

In recent years, thin film electronic and magnetic devices have become of greater and greater commercial importance. As the need for precision in providing such films has also increased, a number of methods have been developed for more accurately providing such films. These include chemical vapor deposition techniques, molecular beam epitaxy techniques, etc.

The success of such methods depends to a considerable extent on the effusion cell which is the source of the atoms or molecules that are to be deposited on a selected substrate. Such an effusion cell typically has a crucible formed of high purity materials which are able to withstand high temperatures while being maintained in a hard vacuum. A material from which such a beam is to be formed is provided therein usually in a phase other than gaseous. In common uses of such cells requiring the beam-forming material to be converted to a gaseous state, crucible structure materials are chosen that can operate at elevated temperatures on the order of 1500° C. and in a vacuum of typically $10^{-10}$ torr. Both outgassing from such materials, and the decomposition at such temperatures and vacuums, must be avoided to avoid severely contaminating the layers being deposited on the substrate. The presence and density of the various kinds of atoms or molecules impinging on the substrate is directly responsible for the composition of the layer being deposited.

The flux of the atomic or molecular beam impinging on the selected substrate from the effusion cell is a direct function of the vapor pressure of the beam material contained within the cell crucible. This vapor pressure in turn depends on the temperature occurring in that crucible, and depends rather strongly thereon as the flux has an exponential-like relationship to temperature. Thus, fractions of a degree of temperature can make significant changes in the beam flux. As a result, the composition and thickness of layers to be deposited, if they are to be reproducible, require that the crucible be accurately maintained at a constant temperature.

However, there are a number of difficulties in maintaining such a constant temperature in such a crucible and in avoiding contamination from crucible structure outgassing or decomposition. Deposition sources today typically have a serpentine conductive heating element positioned around the crucible at a distance therefrom, and the heating of the crucible will be mostly by radiation in these circumstances with little conduction. Such a heating element is often constrained to have a shape that often does not conform to the crucible shape thereby leading to low heating efficiency. In addition, the heater temperature as a result is going to be substantially higher than that to which the crucible is desired to be raised, a situation which causes added outgassing from the heater element and reduces its lifetime. The non-uniform spatial distribution of the heating elements means that the crucible will have resulting hot and cold zones making achieving of temperature uniformity difficult.

The design alternatives permitted for such a crucible are often limited by considerations necessary in positioning such heating elements around the crucible. The crucible usually has a relatively large opening at the position the beam is to emerge therefrom which results in substantial radiation loss through that opening thereby lowering crucible interior temperatures nearby. This situation leads to uneven heating of the beam-forming material contained within that crucible. Thus, there is desired a deposition source which provides a crucible permitting more uniform temperatures to be maintained therein. In addition, there is a desire to provide a deposition source exhibiting reduced outgassing from its components during use. Further, there is desire for a source which can provide a material beam displaying good directivity. A further concern, in those deposition processes in which a heated substrate is used, is the uniformity of its heating and outgassing from the heater used therefor.

SUMMARY OF THE INVENTION

The present invention provides a gaseous deposition source for providing a deposition material that emanates from a crucible having multiple thin film heating elements thereon each pair of which is separated by an insulating layer. The deposition source may have a crucible having a cover thereon with one or more apertures therein and one or more heating elements on that cover about such an aperture. These heating elements are thin film heating elements, and further such elements can be provided about the crucible as a source of heating for the deposition material therein. Multiple ones of these heating elements can be provided in layers for each with an insulating layer therebetween. Substrate heaters can also be formed with such heating elements on a base.

DETAILED DESCRIPTION OF THE PREFERRED EMBODIMENTS

Figure 1:
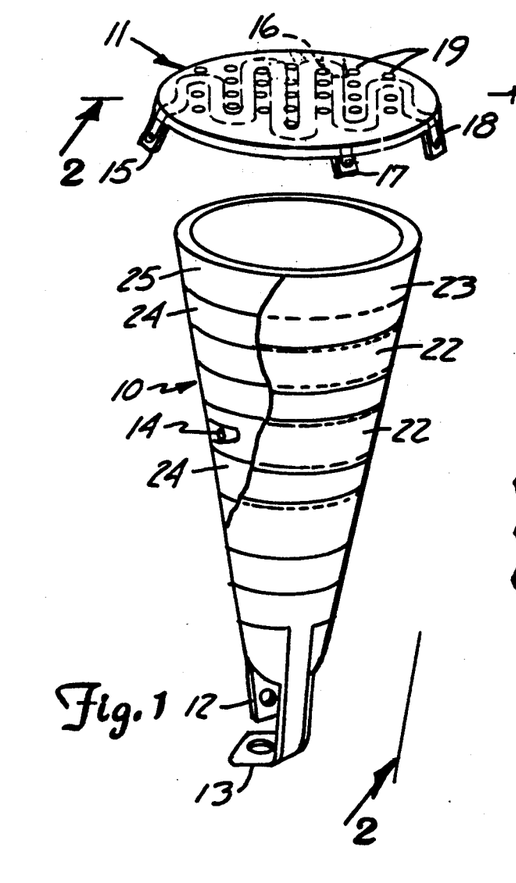
FIG. 1 shows a pictorial view of an embodiment of the present invention having portions thereof separated from one another and a part of one of these portions removed.

FIG. 1 shows a pictorial view of a high temperature crucible, 10, for use in an effusion cell, and its cover, 11, which is shown separated from crucible 10. Crucible 10 is shown to have a somewhat conical shape with a pair of electrical terminal portions, 12 and 13, provided on the bottom thereof in FIG. 1. In addition, crucible 10 is shown with its outer layers partially cut away in FIG. 1 to reveal an inner layer and a thermocouple means, 14.

Similarly, cover 11 is shown with four terminal portions, 15, 16, 17 and 18, extending therefrom. In addition, cover 11 has a number of apertures, 19, extending therethrough.

Figure 2:
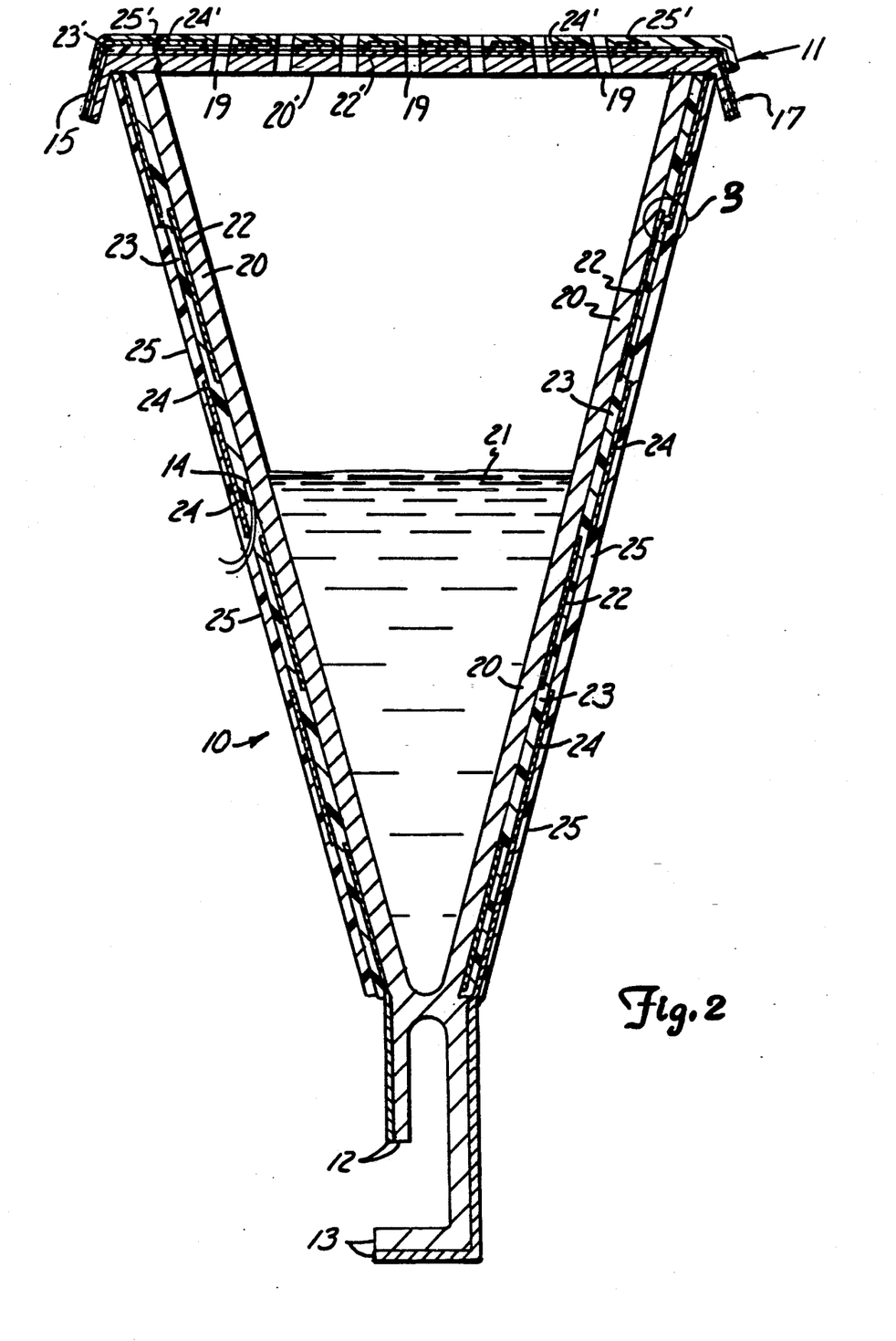
FIG. 2 shows a cross section view from FIG. 1 showing together the portions shown separated there.

A cross section view of the structure of FIG. 1 is shown in FIG. 2 with cover 11 positioned on crucible 10. Crucible 10 is formed of an inner, conical-like shape, containment shell or containment vessel, 20, formed of high purity pyrolytic boron nitride with a wall thickness typically of 1.0 mm. This wall thickness is sufficient to provide adequate strength for shell 20 at the elevated temperatures used in operation, as indicated above. Shell 20 has a melt, 21, of a selected material provided therein in a selected phase from which there is to be evaporation due to heating to provide the basis for gaseous diffusion through cover 11. In some circumstances, material 21 would be supplied from an appropriate source to the interior of shell 20 already in gaseous form to be further heated therein.

Formed on the outer side of shell 20 is a first layer heating element, 22, spirally positioned on and about the outer surface of shell 20. A peninsular tab portion of shell 20 extends outward from the bottom thereof with a portion of heating element 22 provided thereon to form electrical terminal portion 12.

Heating element 22 is formed of pyrolytic graphite which is applied to the outer surface of shell 20 using a well known chemical vapor deposition process, the deposition continuing to a typical thickness of from 1.0 to a few mils to thereby set the thickness of heating element 22. After the deposition of the pyrolytic graphite, the resulting graphite surface is selectively masked through a well known process and the selected unmasked portions thereof are etched away using again a well known process. The result is to leave heater element 22 spirally positioned on and about the outer surface of shell 20 and over the portion of crucible 10 involved in terminal portion 12. Other heater position configurations could alternatively be used.

The thickness chosen for heating element 22 is usually set by electrical considerations given the limitations imposed on that element by geometrical constraints and thermal mismatch considerations. The total resistance of heating element 22 is chosen to be a value which will accommodate the value of the voltage to be provided by a power supply thereacross to ensure adequate heating with the element thickness set accordingly.

Heating element 22 is encapsulated by an electrical insulating layer, 23, formed of pyrolytic boron nitride provided again by a well known chemical vapor deposition process. Insulating layer 23 is deposited to from 1.0 to a few mils in thickness as sufficient to prevent any pinholes from remaining therethrough which could lead to there being an electrical short circuit between heating element 22 and the conductor to be provided on the outer surface of insulating layer 23. Further, insulating layer 23 must be sufficiently thick to prevent any voltage breakdown thereacross if heating element 22 and such other outer surface conductor are operated at a significant voltage differential.

A second layer heating element, 24, is then provided on insulating layer 23, once again using a well known chemical vapor deposition process. Again, pyrolytic graphite is deposited as heater element 24, and this deposition is then masked and etched to leave heater element 24 positioned over at least the gaps between successive loops of heating element 22, the heating element closest to shell 20. Thus, heating element 24 provides heat in the gaps between the adjacent loops of heating element 22 to thereby together provide a more uniform source of heat along the conical-like walls of shell 20 to be applied to the interior thereof including to material 21 contained in the interior of shell 20 in its initial phase, as a melt and as a gas evaporated therefrom.

A small portion of heating element 24 is provided extending out onto a peninsular tab portion formed outward from shell 20 to thereby form terminal portion 13. External connections of wires can be made to this terminal portion and terminal portion 12 by bonding one to the other through use of high temperature ceramic bonding compounds such as known bonding compounds having a combination of yttrium oxide, zirconia and silicon nitride therein. Alternatively, high temperature fasteners can be used to bond the external wires to these terminal portions by having such fasteners inserted through the holes shown therein.

This uniformity of heating provided from a source closely adjacent to shell 20 allows heating elements 22 and 24 to operate at lower temperatures than would otherwise be possible, and therefore provides longer life for these heaters. In addition, there is less contamination of the layers deposited on the selected substrate because of the resulting reduction in outgassing from these heaters.

First layer heating element 22 and second layer heating element 24 can be operated electrically in parallel with one another, or they can be operated in series with one another. Alternatively, each may be operated independently of the other. The use of multiple layers of heaters (more than two could be provided) permits changing electrical parameters for the combination of the heating elements involved so that a desired effective resistance results even though there are space limitations and thermal mismatch considerations which may limit how wide or thick a single layer heating element can be.

Figure 3:
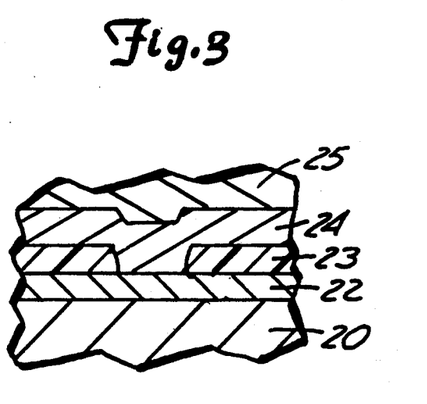
FIG. 3 shows a fragmentary cross section view of a portion of FIG. 2.

The arrangement in FIGS. 1 and 2 is shown to be an electrical series arrangement since only two terminal portions are shown to be available, those being terminal portions 12 and 13. This has been made possible by the use of a "feed through" formed by a portion of heating element 24 passing through insulating layer 23 to thereby be in electrical contact with inner heating element 22. This can be seen in the upper right hand side of FIG. 2, and in greater detail in FIG. 3 which is a fragmentary view of a portion of FIG. 2 enlarged. This interconnection puts inner heating element 22 and outer heating element 24 electrically in series between terminal portions 12 and 13.

The temperature attained in operating crucible 10 by passing an appropriate current through inner heating conductor 22 and outer heating conductor 24 can be accurately monitored through the presence of thin film thermocouple 14, shown on the left in FIG. 1 and shown on the left side of shell 20 in FIG. 2. A pair of wires, each connected to an appropriate one of the pair of overlapping thin films comprising thermocouple 14, are shown extending therefrom in FIG. 2.

All of this structure on the outer side of shell 20 is then finally covered by a protective layer, 25, of pyrolytic boron nitride, again deposited using a well known chemical vapor deposition process to a thickness of 1.0 to a few mils. Protective layer 25 prevents outer conductor 24 therebeneath from adsorbing gaseous impurities when out in the open which could later outgas at the crucible operating temperatures. Further, the pyrolytic graphite in outer heater 24, in the absence of protective layer 25, may react with residual molecules occurring thereabout even after a hard vacuum has been pulled therein. Note that all of the structure shown on the outer walls of shell 20 is greatly exaggerated in thickness for purposes of clarity.

This structure shown on the outer side of shell 20 in FIGS. 1 and 2 is shown located there as a matter of choice. An entirely analogous structure could alternatively be provided on the inner side of shell 20. Heating conductors 22 and 24 can be lengthened sufficiently to reach terminal portions extending from shell 20 such as 12 and 13 either over the upper edge of, or through, shell 20.

Although crucible 10 is shown in FIGS. 1 and 2 to be conical-like in shape, other shapes are possible and even made more feasible by the use of thin film heaters deposited directly on the inner or outer walls of the containment vessel. That containment vessel could, for instance, be caused to constrict flow before reaching the effusion opening by being formed into a vase-like shape through having a narrow, but open, neck near that effusion opening. The vessel from there flares out to from the effusion opening to thereby reduce radiation losses through that output opening. Temperature uniformity for such a structure is enhanced by having inner heating element 22 or outer heating element 24 provided near such a "necked down" portion of crucible 10. Further, the resulting flared section past this narrow opening could also have heating elements formed thereon which would help to form the molecular beam based on the gaseous material effusing from the constricted portion of the crucible.

Figure 4:
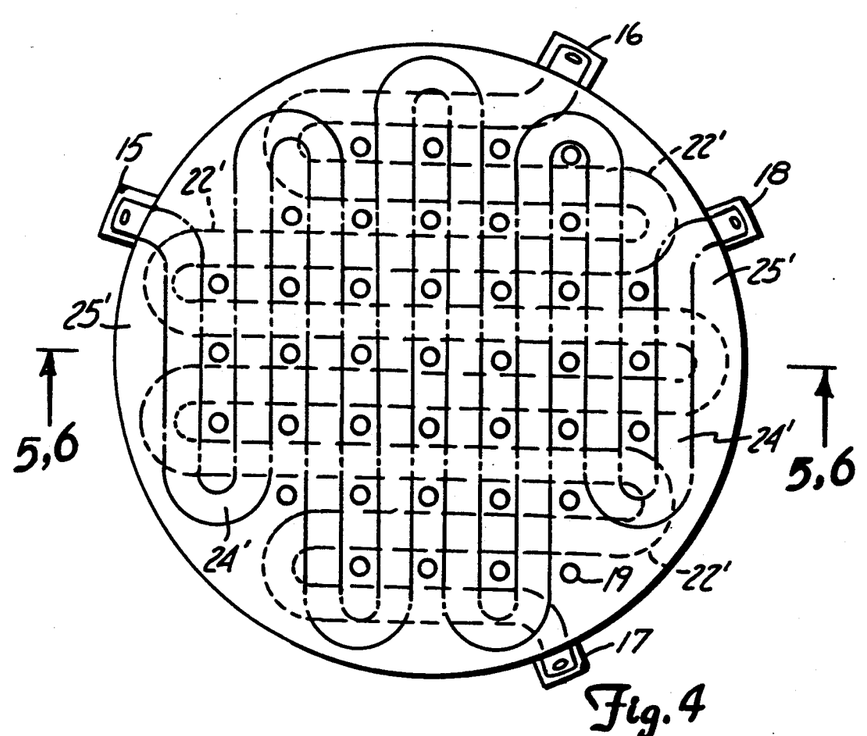
FIG. 4 shows a top view of a portion of the present invention.

A more direct means for accomplishing such results is to use perforated cover 11 shown in FIG. 1 and in more detail in FIGS. 2 and 4. FIG. 4 shows the top view of cover 11 having apertures 19 extending therethrough. Formed about apertures 19 on a substrate, 20', are two further thin film heating elements, including an inner heating element, 22', shown in dashed lines, and an outer heating element, 24', also shown in dashed lines though dashed differently. These two heating elements are again separated by an insulating layer, 23', of pyrolytic boron nitride with heating element 22' being formed directly on the pyrolytic boron nitride substrate used for cover 11. Again, a pyrolytic boron nitride outer protective layer, 25', covers the structure shown therebelow in FIGS. 2 and 4.

Provision of this structure on substrate 20'used for cover 11 is done in the same manner as the provision of the structure on the outer side of shell 20 in forming crucible 10. Apertures 19 can be drilled either before or after such processing has been completed.

As can be seen in FIGS. 2 and 4, inner heating element 22' and outer heating element 24' each have both ends thereof coming onto a corresponding pair of terminal portions based on peninsular tab portions extending downward and outward from the substrate on which cover 11 is based. Outer heating element 24' has its ends terminating on terminal portions 15 and 18, and inner heating element 22' has its ends terminating on terminal portions 16 and 17. External connections of wires can be made to these terminal portions through use of high temperature ceramic compounds to bond one to the other. Alternatively, high temperature fasteners can be used to bond the external wires to these terminal portions by having such fasteners inserted through the holes shown therein. A further thin film thermocouple can be provided in cover of the same nature as thermocouple 14 described above.

The use of cover 11 reduces radiation loss from the opening of crucible 10 considerably to thereby keep the beam-forming material inside crucible 10 much closer to being at a constant temperature everywhere. Placing such a cover over the effusion opening or exit for the gaseous phase of this material in crucible 10 allows a considerably higher vapor pressure to be generated therein which, with a relatively uniform temperature, permits constant and reproducible molecular beam fluxes to be provided with more uniform deposition results.

The provision of cover 11 also acts as a stop to prevent "spitting" or "spilling" of the beam-forming material. Such actions occur in the beam-forming material because of trapped gases therein or surface volatile compounds, or even because of the material "creeping" along the crucible wall due to surface tension, and often lead to defects in the thin films being deposited on a selected substrate. Thus, provision of cover eliminates such undesirable results.

Inner heating element 22' and outer heating element 24' provided independently on cover 11 permit cover 11 to be operated at different, and particularly, at higher temperatures than crucible 10. Such higher temperatures in cover 11 prevent condensation of the beam-forming material effusing at apertures 19 which can easily cause undesirable changes in the beam flux. Also, the covering of heating elements 22' and 24' by protective layer 25' keeps them from being exposed directly to the substrate on which thin films are being deposited. This avoids the incorporation into the films being deposited of contaminants arising from the heating of these heating elements.

Figure 5:
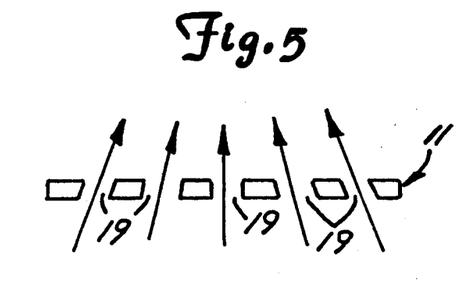
FIG. 5 shows a cross section view of a portion of FIG. 4.
Figure 6:
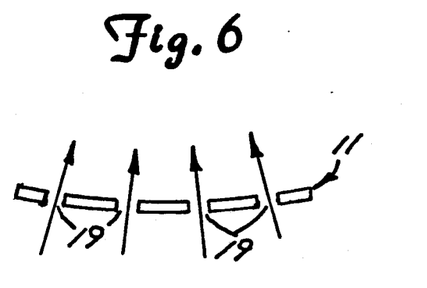
FIG. 6 shows an alternative cross section of a portion of FIG. 4.

FIGS. 5 and 6 show two examples of the shaping of either cover 11 or apertures 19 provided therethrough to thereby control the spatial distribution of the material beam. FIG. 5 shows apertures 19 being formed in a flat version of cover plate 11. However, apertures 19 in that version intersect the surfaces of that cover at an angle with respect to a perpendicular to such surfaces so that the beam-forming material escaping through apertures 19 tends to have dominant velocity components such as cause the beam to converge. On the other hand, cover 11 can just as well have a convex shape with respect to the inside of crucible 10, but with apertures 19 then paralleling the corresponding local perpendicular to the surface of cover 11. Again, the beam will tend to converge at some point beyond the effusion cell.

Figure 7:
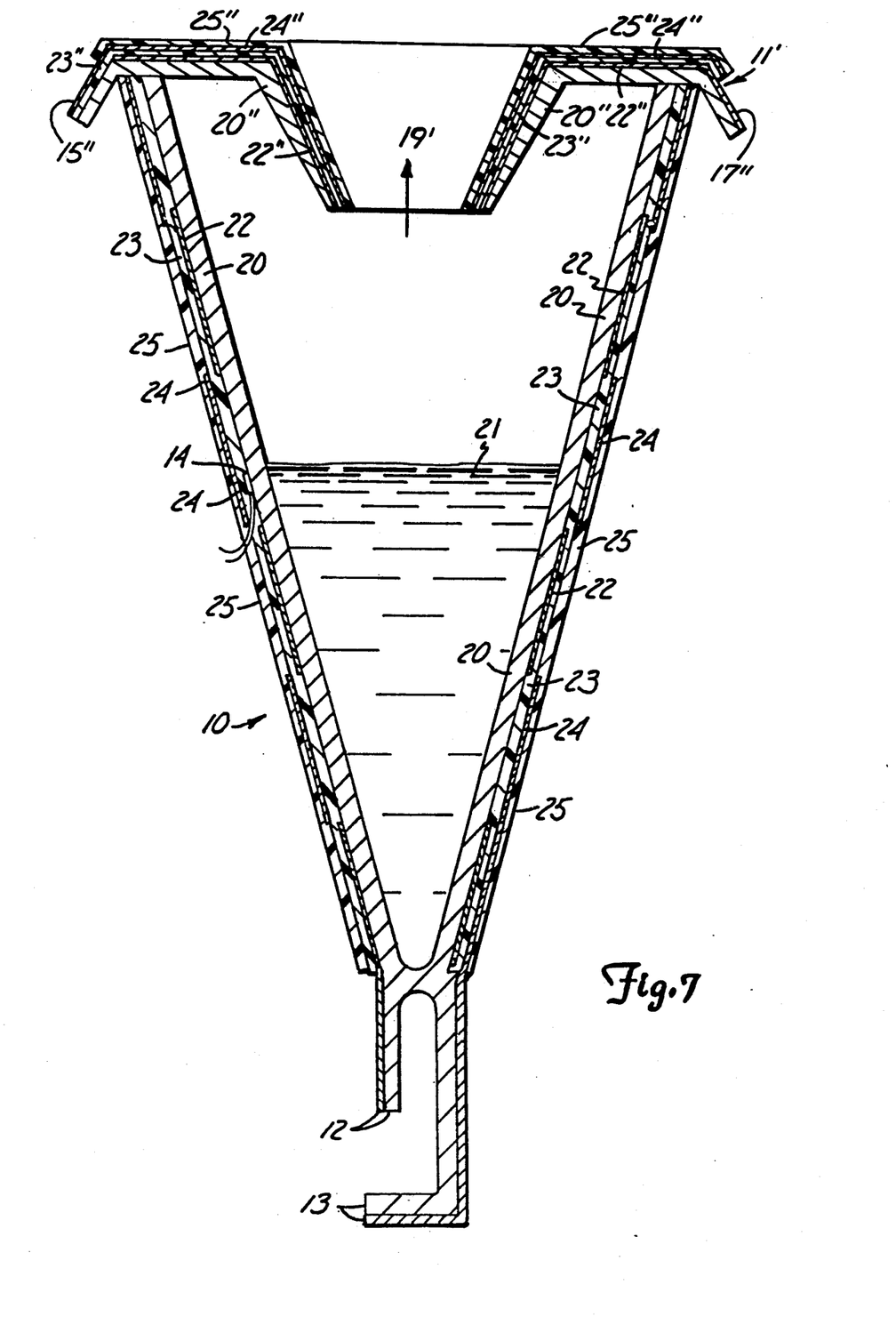
FIG. 7 shows a cross section view that is an alternative to that of FIG. 2 based on an alternative embodiment.

FIG. 7 shows an alternative cover plate, 11', formed on a substrate, 20", having an inner heating element, 22", and an outer heating element, 24", separated by an insulating layer, 23", provided thereon, and covered by a protective layer, 25". Heating elements 22" and 24" are not shown mostly perpendicular with respect to each other as in FIGS. 2 and 4 but, instead, are mostly parallel to each other with one being mostly positioned in the gaps between adjacent portions of the other. In FIG. 7, inner heating element 22" has an end thereof shown terminating on a terminal portion, 16"', and outer heating element 24" has an end thereof shown terminating on a terminal portion, 17". These structural portions are each formed as the corresponding structural portions shown in FIGS. 1 and 2.

A single aperture, 19', occurs through cover 11' in a central portion thereof formed as a truncated cone which extends inward into the interior of crucible 10.

This arrangement for aperture 19' can also provide material beam directivity and good flow volume, and can in some circumstances provide more uniform heating at this aperture because of its position in the interior of crucible 10.

If apertures 19 are omitted, cover 11 can alteratively serve as a flat heater for heating substrates upon which material depositions are to be made. The multiple heating elements 22' and 24' will provide very good temperature uniformity across such a structure. Further, the covering of such heating elements in the resulting structure will prevent outgassing therefrom.

Although the present invention has been described with reference to preferred embodiments, workers skilled in the art will recognize that changes may be made in form and detail without departing from the spirit and scope of the invention.

What is claimed is:

1. A substrate heater for providing relatively uniform heat to a substrate during depositions of gaseous material which enters a different phase thereon, said heater comprising:

a plate means having a first major surface;

a first thin film electrical heating element disposed on said first major surface; and a second thin film electrical heating element provided on said major surface over said first thin film electrical heating element but separated therefrom an a first insulating layer capable of keeping said first and second thin film electrical heating elements electrically insulated from one another at temperatures used with said substrates in said deposition of gaseous material.

2. The apparatus of claim 1 wherein said plate means has a peninsular first tab portion extending away from that part thereof supporting most of said first thin film electrical heating element but with a portion of said first thin film electrical heating element extending onto said first tab portion where it is adapted for connection to electrical leads adapted for connection to a source of electrical energy.

3. The apparatus of claim 2 wherein said plate means has a peninsular second tab portion extending away from that part thereof supporting most of said first and second thin film electrical heating elements but with a portion of said second thin film electrical heating element extending onto said second tab portion where it is adapted for connection to electrical leads adapted for connection to a source of electrical energy.

4. The apparatus of claim 1 wherein said second thin film electrical heating element has provided thereover a second insulating layer.

* * * * *

UNITED STATES PATENT AND TRADEMARK OFFICE
CERTIFICATE OF CORRECTION

Page 1 of 3

PATENT NO. : 5,157,240

DATED : October 20, 1992

INVENTOR(S) : LOREN A. CHOW

It is certified that error appears in the above-identified patent and that said Letters Patent is hereby corrected as shown below: On the Title page, item [56]

In the References Cited Section, under U.S. PATENT DOCUMENTS, add the following:

| | | | |
|---|---|---|---|
| 1,402,585 | 1/1922 | Epstein et al............ | |
| 1,895,492 | 1/1933 | Shapleigh................ | |
| 3,525,452 | 8/1970 | Hofmann.................. | 219/438 |
| 3,806,701 | 4/1974 | Scott.................... | 219/436 |
| 4,061,800 | 12/1977 | Anderson................. | 219/271 |
| 4,146,774 | 3/1979 | Fraas..................... | 219/271 |
| 4,286,545 | 9/1981 | Takaqui et al............ | 118/723 |
| 4,330,932 | 5/1982 | Morris et al............. | 29/579 |
| 4,396,899 | 8/1983 | Ohno..................... | 338/34 |
| 4,426,569 | 1/1984 | Miller et al............. | |
| 4,447,276 | 5/1984 | Davies et al............. | 148/175 |
| 4,495,155 | 1/1985 | Ricard et al............. | 422/248 |
| 4,518,846 | 5/1985 | Freeouf et al............ | |
| 4,534,312 | 8/1985 | Shinya et al............. | 188/666 |
| 4,543,467 | 7/1985 | Eisele et al............. | |
| 4,545,339 | 10/1985 | Brooks et al............. | 123/145 |
| 4,553,022 | 11/1985 | Colombo.................. | |

UNITED STATES PATENT AND TRADEMARK OFFICE
CERTIFICATE OF CORRECTION

Page 2 of 3

PATENT NO. : 5,157,240
DATED : October 20, 1992
INVENTOR(S) : LOREN A. CHOW

It is certified that error appears in the above-identified patent and that said Letters Patent is hereby corrected as shown below:

In the References Cited Section, under U.S. PATENT DOCUMENTS, add the following:

| | | | |
|---|---|---|---|
| 4,560,907 | 12/1985 | Tamura et al............... | 325/111 |
| 4,587,843 | 5/1986 | Tokura et al............... | 73/204 |
| 4,662,981 | 5/1987 | Fujiyasu et al............ | 156/610 |
| 4,700,660 | 10/1987 | Levchenko et al........... | 118/726 |
| 4,726,822 | 2/1988 | Cates et al............... | 55/267 |
| 4,734,563 | 3/1988 | Lloyd...................... | 219/543 |
| 4,739,657 | 4/1988 | Higashi et al............. | 73/204 |
| 4,748,315 | 5/1988 | Takahashi et al........... | |
| 4,748,367 | 5/1988 | Bloch et al............... | 310/343 |
| 4,782,708 | 11/1988 | Harrington et al.......... | 73/861 |
| 4,812,326 | 3/1989 | Tsukazaki et al........... | 427/38 |

In the References Cited Section, insert the following:

UNITED STATES PATENT AND TRADEMARK OFFICE
CERTIFICATE OF CORRECTION

PATENT NO. : 5,157,240

DATED : October 20, 1992

INVENTOR(S) : Loren A. Chow

It is certified that error appears in the above-indentified patent and that said Letters Patent is hereby corrected as shown below:

under OTHER PUBLICATIONS

Advertising Brochure: "Boralloy Pyrolytic Boron Nitride (PBN)/ Pryolytic Graphite (PG) Resistance Heating Elements," Union Carbide Coatings Service Corporation.

Col. 8, line 1, delete "an", insert by--.

Signed and Sealed this

Twenty-eighth Day of September, 1993

Attest:

BRUCE LEHMAN

Attesting Officer    Commissioner of Patents and Trademarks